United States Patent [19]
Blinkhorn

[11] 3,728,471
[45] Apr. 17, 1973

[54] PRINTED CIRCUIT BOARDS WITH KNOCKOUTS

[75] Inventor: Harold L. Blinkhorn, Goshen, Ohio

[73] Assignee: The Raymond Lee Organization, Inc., New York, N.Y.

[22] Filed: Oct. 8, 1971

[21] Appl. No.: 187,661

[52] U.S. Cl. ................174/68.5, 29/625, 29/DIG. 33, 317/101 CE

[51] Int. Cl. ................H05k 7/06

[58] Field of Search ................174/68.5; 29/625, 29/626, 101 CE

[56] References Cited

UNITED STATES PATENTS

| | | | |
|---|---|---|---|
| 3,033,914 | 5/1962 | Acosta-Lleras | 174/68.5 |
| 3,493,671 | 2/1970 | Horwitz et al. | 174/68.5 |

*Primary Examiner*—Bernard A. Gilheany
*Attorney*—Richard S. Shreve, Jr.

[57] ABSTRACT

Electrically non conductive relatively flexible board has electrically conductive parallel lines printed thereon, each line having spaced circular regions with transverse bores with circular peripheral groove permitting ease of removal.

2 Claims, 2 Drawing Figures

INVENTOR.
HAROLD L. BLINKHORN

PRINTED CIRCUIT BOARDS WITH KNOCKOUTS

FIELD OF THE INVENTION

My invention is directed toward a printed circuit board which can be easily and manually modified to be usable in a wide range of applications, thus enabling a small volume user to avoid the extensive effort and expense to produce special boards in small quantities as otherwise required.

SUMMARY

In my invention, an electrically non-conductive sheet has a plurality of spaced parallel electrically conductive lines printed thereon. Each line is provided at spaced regions with small individual removable regions. Each region can be easily removed manually to interrupt or break the electrical conductivity of the line at the point at which the region is removed.

In conventional applications, electronic components are first grouped as desired and a special printed circuit is then designed for such use. In my invention, the components are grouped to be connected in my board by placing these components parallel to, at angles to or across the conductive lines after the requisite regions have been removed to break or interrupt conductivity as required.

These regions can be so shaped and formed as to be easily "knocked out" or removed without weakening the board itself.

DETAILED DESCRIPTION OF PREFERRED EMBODIMENTS

Figure 1:
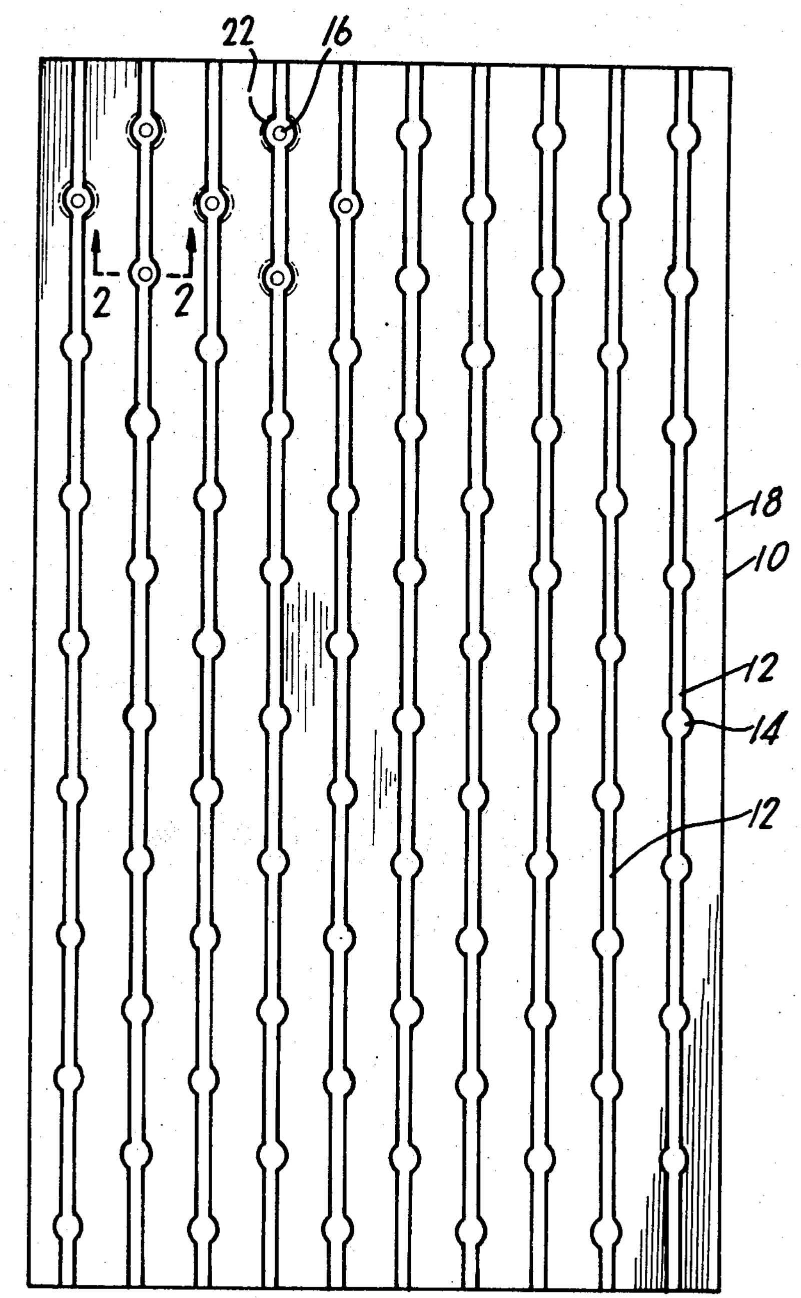
FIG. 1 is a plan of my invention.
Figure 2:
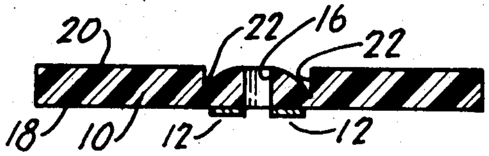
FIG. 2 is a section taken along line 2—2 in FIG. 1.

Referring now to FIGS. 1 and 2, an electrically non-conductive relatively flexible sheet or board 10 of rectangular shape is provided on its top surface 18 with a plurality of spaced parallel elongated electrically conductive printed lines 12.

Each line has spaced circular regions 14. Each region has a centrally disposed transverse bore or hole 16. The side of the region exposed on the rear surface 20 has a circular peripheral groove 22 permitting ease of removal as previously described. The groove is slightly larger than its region.

The corresponding regions on all odd numbered lines are disposed along aligned positions extending at right angles to the printed lines, i.e., these corresponding regions are aligned.

Similarly, the corresponding regions on all even numbered lines are disposed along aligned positions which are intermediate the aligned positions of the odd numbered lines.

The invention can then be used in the manner previously indicated.

While I have described my invention with particular reference to the drawings, such is not to be considered as limiting its actual scope.

Having thus described this invention, what is asserted as new is:

1. Printed circuit board comprising an elongated flat sheet having top and bottom surfaces;
   - a plurality of spaced parallel electrically conductive lines printed on one surface of the sheet, each line having spaced small individually removable regions;
   - each region being circular and extending somewhat beyond the line it is on; and
   - the opposite surface of the sheet carrying spaced circular grooves, each groove being aligned with a corresponding region and being of similar diameter.

2. The printed circuit board according to claim 1 wherein each region has a central bore extending transversely through the sheet.

* * * * *